United States Patent
Ogawa

(10) Patent No.: US 9,877,399 B2
(45) Date of Patent: Jan. 23, 2018

(54) LEAD SOLDER JOINT STRUCTURE AND MANUFACTURING METHOD THEREOF

(71) Applicant: NEC Space Technologies, Ltd, Fuchu-shi, Tokyo (JP)

(72) Inventor: Bunsuke Ogawa, Tokyo (JP)

(73) Assignee: NEC SPACE TECHNOLOGIES, LTD.

( * ) Notice: Subject to any disclaimer, the term of this patent is extended or adjusted under 35 U.S.C. 154(b) by 0 days.

(21) Appl. No.: 15/259,226

(22) Filed: Sep. 8, 2016

(65) Prior Publication Data
US 2017/0079147 A1    Mar. 16, 2017

(30) Foreign Application Priority Data

Sep. 11, 2015  (JP) ................................. 2015-179112
Aug. 5, 2016   (JP) ................................. 2016-154442

(51) Int. Cl.
| | |
|---|---|
| H05K 1/09 | (2006.01) |
| H05K 3/34 | (2006.01) |
| H05K 1/18 | (2006.01) |
| B23K 1/00 | (2006.01) |
| B23K 35/26 | (2006.01) |

(Continued)

(52) U.S. Cl.
CPC .......... *H05K 3/3457* (2013.01); *B23K 1/0016* (2013.01); *B23K 20/026* (2013.01); *B23K 35/268* (2013.01); *H05K 1/09* (2013.01); *H05K 1/181* (2013.01); *H05K 3/3494* (2013.01); *B23K 2201/38* (2013.01); *H05K 2201/0338* (2013.01)

(58) Field of Classification Search
CPC ...... H05K 3/34; H05K 3/3426; H05K 3/3463; B23K 35/26; B23K 35/34; B23K 35/262

USPC .......... 174/257, 260, 261; 336/83, 185, 192; 428/107; 148/23, 24, 26; 228/37, 110.1, 228/111.5, 173.2, 234.2, 354
See application file for complete search history.

(56) References Cited

U.S. PATENT DOCUMENTS

| | | | |
|---|---|---|---|
| 4,720,034 A * | 1/1988 | Lee ...................... | H05K 3/3426 118/423 |
| 5,145,532 A * | 9/1992 | Fukunaga ............ | B23K 35/262 148/23 |
| 5,477,419 A | 12/1995 | Goodman et al. | |

(Continued)

FOREIGN PATENT DOCUMENTS

| | | |
|---|---|---|
| JP | S57-82065 U1 | 11/1980 |
| JP | S60-194062 A | 10/1985 |

(Continued)

OTHER PUBLICATIONS

Extended European Search Report for EP Application No. EP16187779.0 dated Apr. 18, 2017.

(Continued)

*Primary Examiner* — Xiaoliang Chen

(57) ABSTRACT

[Problem] Even if heat cycles are applied, degradation of joint strength is restrained.
[Solution to problem] Lead solder joint structure, in which a first member is joined to a second member using lead solder, the structure comprising: a first solder layer that includes the first member as a core; a second solder layer that exists between the first solder layer and the second member and joins the first solder layer and the second member together; and a third solder layer that exists between the second solder layer and the second member.

4 Claims, 3 Drawing Sheets

(51) Int. Cl.
*B23K 20/02* (2006.01)
*B23K 101/38* (2006.01)

(56) References Cited

U.S. PATENT DOCUMENTS

| | | | |
|---|---|---|---|
| 5,803,344 A | 9/1998 | Stankavich et al. | |
| 5,873,816 A * | 2/1999 | Kagawa | A61B 1/00114 |
| | | | 600/110 |
| 6,027,008 A * | 2/2000 | Toi | B23K 20/023 |
| | | | 228/110.1 |
| 6,119,924 A * | 9/2000 | Toi | B23K 20/023 |
| | | | 228/179.1 |
| 6,313,412 B1 * | 11/2001 | Trumble | B23K 35/262 |
| | | | 174/260 |
| 6,515,566 B1 * | 2/2003 | Toi | H01F 27/292 |
| | | | 336/185 |
| 2001/0006450 A1 * | 7/2001 | Kobayashi | H01G 4/105 |
| | | | 361/306.3 |
| 2002/0047186 A1 * | 4/2002 | Tellkamp | H01L 23/49582 |
| | | | 257/666 |
| 2004/0126927 A1 * | 7/2004 | Lin | H01L 21/568 |
| | | | 438/107 |
| 2004/0253474 A1 * | 12/2004 | Akamatsu | B23K 3/0638 |
| | | | 428/615 |
| 2005/0211461 A1 * | 9/2005 | Horikoshi | C25D 5/10 |
| | | | 174/117 FF |
| 2014/0060611 A1 | 3/2014 | Koch et al. | |
| 2016/0218074 A1 * | 7/2016 | Seddon | H01L 24/11 |

FOREIGN PATENT DOCUMENTS

| | | |
|---|---|---|
| JP | S62-86895 A | 4/1987 |
| JP | H05-259632 A | 10/1993 |
| JP | 2001-345467 A | 12/2001 |
| JP | 2013-016726 A | 1/2013 |
| JP | 5231727 B2 | 7/2013 |

OTHER PUBLICATIONS

Japanese Office Action for JP Application No. 2016-154442 dated Sep. 5, 2017 with English Translation.

* cited by examiner

LEAD SOLDER JOINT STRUCTURE AND MANUFACTURING METHOD THEREOF

This application is based upon and claims the benefit of priority from Japanese Patent Application No. 2015-179112, filed on Sep. 11, 2015, and Japanese Patent Application No. 2016-154442, filed on Aug. 5, 2016, the disclosures of all of which are incorporated herein in their entirety by reference.

TECHNICAL FIELD

The present invention relates to a lead solder joint structure and a manufacturing method thereof that suppress the occurrence of phase transition of solder at the time of usage.

BACKGROUND ART

While solder is used in various apparatuses, recently, use of lead solder is restricted in some cases. On the other hand, the use of lead solder is not restricted in a field of aerospace. Since joint strength of a solder joint portion that uses such lead solder affects reliability of apparatuses, it is desired that the joint strength is high.

When a soldered portion connected by use of the above-mentioned solder is exposed to a high temperature environment, there is a problem that an intermetallic compound grows in the lead solder of the joint portion based on the Arrenius's rule, and metallic crystalline grains of the solder become coarse and consequently degradation of the joint strength progresses.

For example, Japanese Patent Application Laid-Open Publication No. 1993-259632 discloses a printed wiring board shown in FIG. 4.

As will be explained later, an object of the art is to improve reliability of joint in a joint process.

That is, according to the above-mentioned printed wiring board, a conductor 102, which forms a wiring pattern made of a copper foil and which is used for soldering electric components to be mounted, is arranged on both surfaces (surface A and surface B) of a substrate 100. A solder layer (first solder layer) 105, which includes lead and an intermetallic compound of tin, is arranged on the conductor 102 of the surface A (one surface). Moreover, a solder layer (second solder layer) 104, which is tin-lead based solder layer (tin-lead 63/37), is arranged on the conductor 102 of the surface B (the other surface). Here, a melting point (227 degrees centigrade) of the solder layer 105 on the surface A is higher than a melting point (183 degrees centigrade) of the solder layer 104 on the surface B.

As mentioned above, the solder layers, each of which has the same composition and is made of an alloy of tin and lead, are formed on the conductors formed on both surfaces of the substrate 102, and the solder layer formed on the one surface is changed to an alloy of lead and an intermetallic compound of tin by carrying out the heating process. Since the melting point of the solder layer formed on the one surface is higher than the melting point of the solder layer formed on the other surface by virtue of the above mention, it is possible to prevent that a joint portion of an electric component, which has been mounted on the surface A set downward, is melted when melting the solder layer 104 on the surface B.

CITATION LIST

Patent Literature

[PTL 1] Japanese Patent Application Laid-Open Publication No. 1993-259632

SUMMARY

Technical Problem

The structure according to Japanese Patent Application Laid-Open Publication No. 1993-259632 increases the joint strength by making the melting temperature of the tin-based intermetallic compound, which is typically formed when phase transition of the lead solder takes place, different from the melting temperature of the alloy.

Since the intermetallic compound is generally brittle as mentioned above, it is important to have the sufficient joint strength at the time of joint, and furthermore it is also necessary to avoid that the joint strength is degraded at the time of using an electronic device including the solder joint. At the time of using the electronic device, depending on various usage conditions, the joint portion receives an impact of the heat cycle or the like, and consequently it is progressed that the joint portion deteriorates into the intermetallic compound and the metallic crystalline grains of the solder become coarse.

Especially, in an environment, in which a change in temperature is significant, such as space, a high temperature and a severe heat cycle are applied, and consequently there is a case that the joint strength is degraded. Furthermore, in the case of usage in the space environment, it is impossible (difficult) to repair even if the joint strength is degraded.

Accordingly, a main object of the present invention is to provide lead solder joint structure and a manufacturing method thereof which can restrain degradation of the joint strength even if the high temperature or the heat cycle is applied.

Solution to Problem

In order to solve the above-mentioned problem, lead solder joint structure, in which a first member is joined to a second member using lead solder, the structure comprising:
  a first solder layer that includes the first member as a core;
  a second solder layer that exists between the first solder layer and the second member; and
  a third solder layer that exists between the second solder layer and the second member.

A method for manufacturing lead solder joint structure, in which a first member is joined to a second member using lead solder, the method comprising:
  a simple joint layer forming process for forming a simple joint layer by joining the first member and the second layer together using the lead solder; and
  a heat process for heating a joint portion including the simple joint layer under a predetermined condition and forming a first solder layer, a second solder layer and a third solder layer, the first solder layer including the first member as a core, the second solder layer existing between the first solder layer and the second member and joining the first solder layer and the second member together, and the third solder layer existing between the second member and the second solder layer.

Advantageous Effects of Invention

According to the present invention, it is possible to provide the lead solder joint structure and the manufacturing method thereof which can restrain degradation of the joint strength even if the high temperature or the heat cycle is applied.

EXEMPLARY EMBODIMENT

Figure 1:
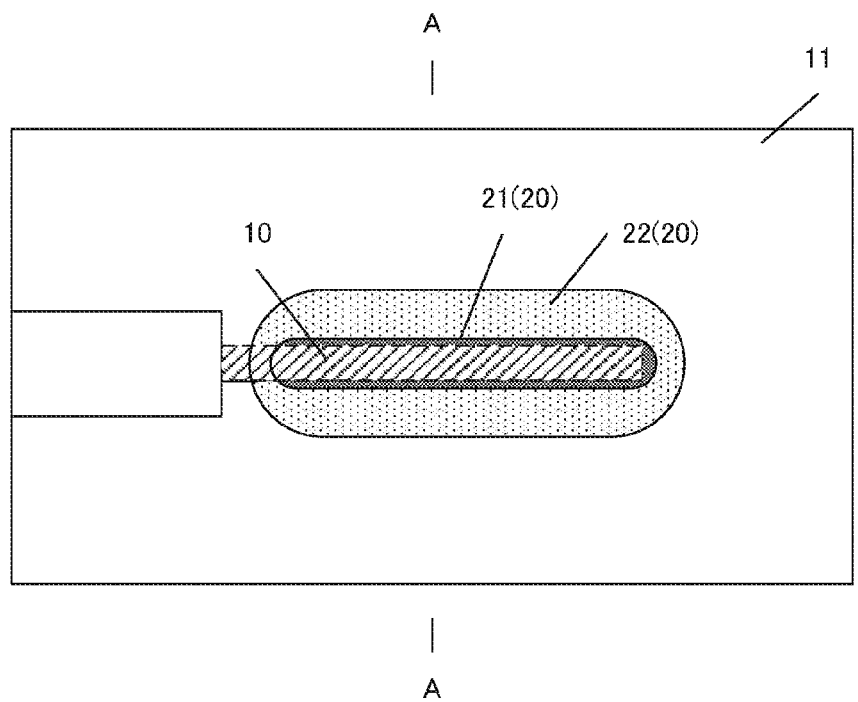
FIG. 1 is a top view of a joint portion for explaining lead solder joint structure according to an exemplary embodiment.

An exemplary embodiment of the present invention will be explained in the following. FIG. 1 is a top view of a joint portion for explaining a lead solder joint structure according to the present exemplary embodiment, and FIG. 2 is a cross section view taken along A-A of FIG. 1.

In the following explanation, Sn10 (Sn: 10%, Ag: 2%, Pb: 88%; solidus line: 267.8 degrees centigrade, liquidus line: 298.9 degrees centigrade) is exemplified as the lead solder.

Figure 2:
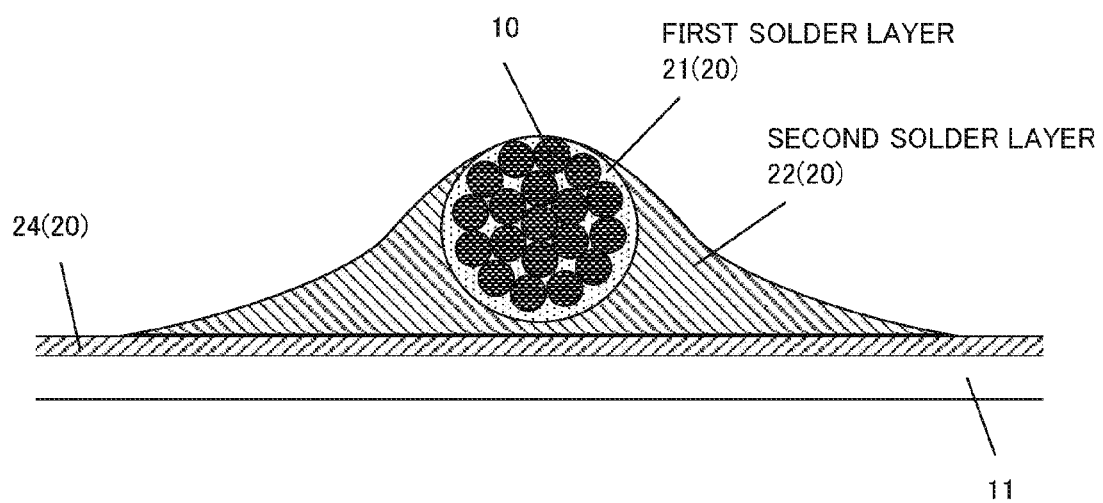
FIG. 2 is a cross section view taken along A-A of FIG. 1.

Each of FIGS. 1 and 2 exemplifies lead solder joint structure 20 in which a wire (first member) 10 is joined to a conductor (second member) 11 by use of the Sn10 solder.

As the conductor 11, a bus bar, which is manufactured by use of a sheet of silver or a sheet of kovar plated with silver, is exemplified. As the wire 10, a wiring member which is copper wire plated with silver is exemplified.

The lead solder joint structure 20 includes a first solder layer 21 that is formed so as to include the wire 10 as a core, a second solder layer 22 which covers the first solder layer 21 and adheres to the conductor 11 through a third solder layer 24, and the third solder layer that exists between the second solder layer 22 and a solder joint surface side of the second member 11.

The first solder layer 21 is a solder layer whose main constituent is a tin-copper based intermetallic compound. Meanwhile, the second solder layer 22 is a solder layer whose main constituent is a lead-based alloy (that is, a solder layer which has a quite small amount of tin, and tin-based intermetallic compound). The third solder layer 24 is a solder layer whose main constituent is a tin-silver based intermetallic compound.

In general, the intermetallic compound is hard and brittle. Accordingly, the tin-copper based intermetallic compound and the tin-silver based intermetallic compound also have the same characteristics. Therefore, when the wire 10 or the conductor 11 is under stress caused by difference in expansion rate associating with heat cycles and the like, brittle fracture and the like may occur at the joint portion. Accordingly, there is a fear that reliability of joint is degraded.

In the case that the above-mentioned lead solder is used as a joint material, the intermetallic compound is gradually formed and the crystalline grains of the solder become coarse when an exposure time to a high temperature state becomes increasing not only continuously but also discontinuously during the course of usage even if a small amount of the intermetallic compound exists at the time of joint.

Especially, in an aerospace environment in which the heat cycles with large temperature difference are applied, the intermetallic compound is gradually formed at the joint portion soldered using the lead solder, and it is progressed that the crystalline grains of the solder become coarse in the forming process. As a result, the reliability of joint is degraded.

Focusing on the point that to form the intermetallic compound completely restrains that the crystalline grains of the solder become coarse, in the present exemplary embodiment, the intermetallic compound is formed as much as possible after the joint portion is formed and before being put into use (before shipping of product) to consume tin completely. As a result, even if receiving the impact of the heat cycles afterward, it is difficult that the intermetallic compound is formed. Therefore, it is possible to restrain that the crystalline grains of the solder become coarse due to forming an alloy of tin and lead. Since tin is consumed when the intermetallic compound is formed, a layer which is rich in tin, and a layer which is poor in tin are formed. The layer which is rich in tin becomes the first solder layer 21 and the third solder layer 24 which are corresponding to the layer including the intermetallic compound. Then, the layer which is poor in tin becomes the second solder layer 22 which is rich in lead. Here, a main constituent of the second solder layer 22, which is rich in lead, is an alloy of lead, and the second solder layer 22 is softer than the intermetallic compound (Young's modulus is low).

Accordingly, the lead solder joint structure 20 according to the present exemplary embodiment is formed from the first solder layer 21 whose main constituent is the intermetallic compound covering the wire 10, the second solder layer 22 whose main constituent is the alloy of lead covering the first solder layer 21, and the third solder layer 24 which exists between the second solder layer 22 and the second member 11 and whose main constituent is the intermetallic compound.

Next, a method for manufacturing the above-mentioned lead solder joint structure 20 will be explained with reference to FIGS. 3A, 3B and 3C.

Figure 3A:
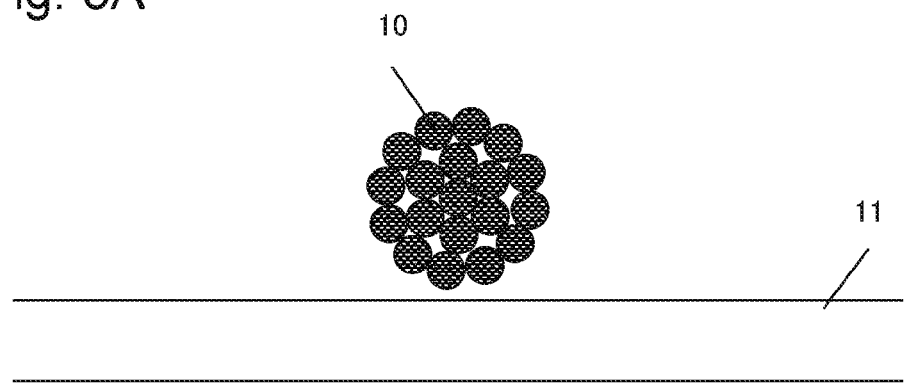
FIG. 3A is one of diagrams explaining a method for manufacturing the lead solder joint structure, and especially is a diagram showing a state previous to joint.
Figure 3B:
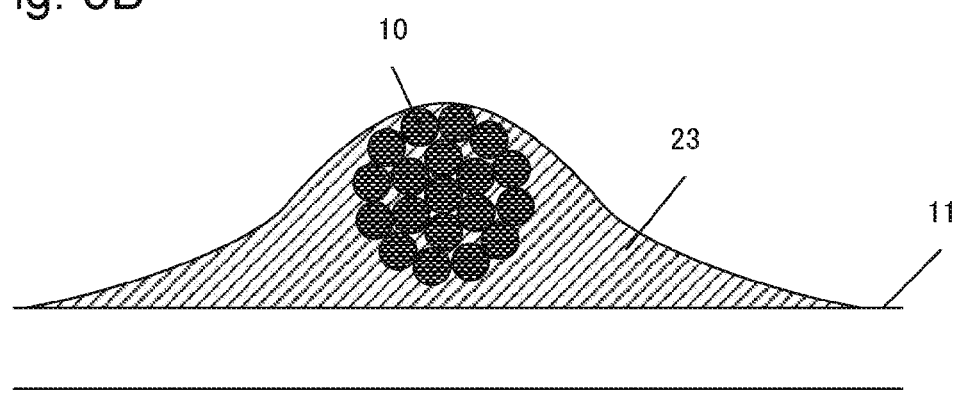
FIG. 3B is one of diagrams explaining the method for manufacturing the lead solder joint structure, and especially is a diagram showing a simple joint layer forming process.

Firstly, as shown in FIG. 3A, the wire 10 is arranged on the conductor 11. Next, as shown in FIG. 3B, the wire 10 is soldered to the conductor 11 by using Sn10. The solder layer just after completion of soldering is denoted by reference numeral 23 in FIG. 3B. In the following explanation, the solder layer is referred to as a simple joint layer 12, and a process for forming the simple joint layer is referred to as a simple joint layer forming process.

In the simple joint layer 12, elements of tin and lead are uniformly distributed over substantially the entire extent of the joint portion, and the amount of the intermetallic compound is small.

The heat process (step of heat process) is carried out on the simple joint layer 12. As a condition of the heat process, a condition that a temperature of the heat process is 200 to 250 degrees centigrade and a time of the heat process is 1500 to 2000 hours is exemplified. By carrying out the heat process, the tin-based intermetallic compound is formed from tin which is included by the simple joint layer 12.

Figure 3C:
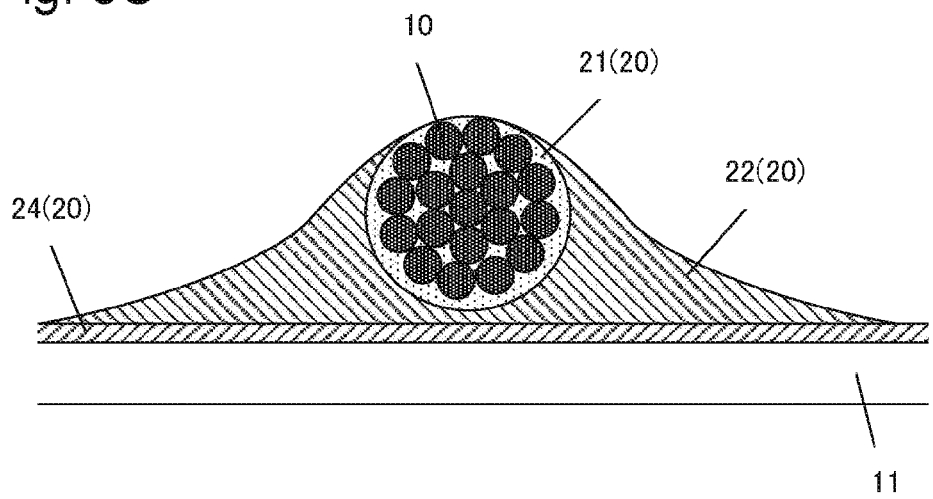
FIG. 3C is one of diagrams explaining the method for manufacturing the lead solder joint structure, and especially is a diagram showing a state after a heat process.
Figure 4:
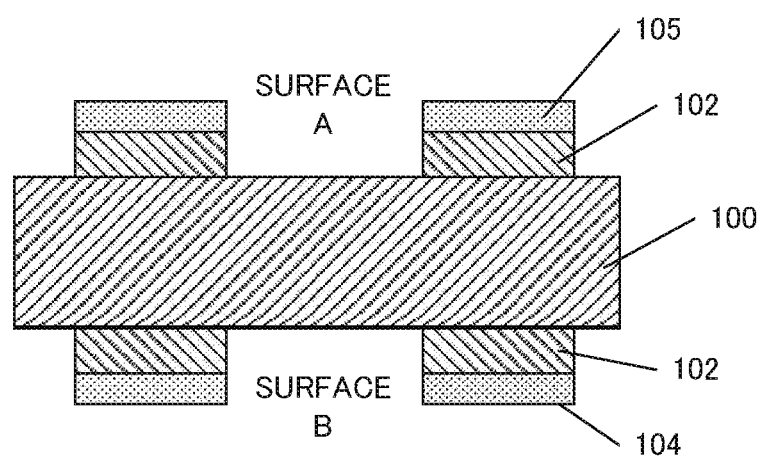
FIG. 4 is a diagram showing lead solder joint structure which is used for explaining a related art.

FIG. 3C is a diagram exemplifying a state just after the completion of the heat process. Specifically, FIG. 3C shows the first solder layer 21 and the third solder layer 24 which are rich in the intermetallic compound, and the second solder layer 22 whose tin is used for forming the first solder layer 21 and the third solder layer 24 and which consequently becomes poor in tin (rich in lead). The first solder layer 21 is the tin-copper based intermetallic compound which is formed by the solder layer 23 and the wire 10 reacting on each other in the heat process. Moreover, the third solder layer 24 is the tin-silver based intermetallic compound which is formed by the solder layer 23 and the conductor 11 reacting on each other in the heat process. By the heat process, the intermetallic compound, which is a brittle member, is formed in advance. In the heat process, various crystalline grains (intermetallic compound and α solid solution including a large amount of lead), which become coarse so that degradation in strength of the solder may be caused at the time of using the electronic device, are not formed. Furthermore, it is possible to reduce kirkendallvoid, which is caused at a time of forming the intermetallic compound, by the heat process carried out for a long time. In general, kirkendallvoid is one of factors which cause a crack in the solder joint, but by carrying out the heat process according to the present exemplary embodiment, it becomes difficult that new kirkendallvoid is formed at a time of using the electronic device.

Furthermore, since a large amount of tin existing in the solder layer 23 is consumed in the heat process for forming the intermetallic compound, the solder layer 23 is changed to the second solder layer 22 which is poor in tin (rich in lead). Since the second solder layer 22 which is rich in lead is soft, even if the wire 10 is under heat stress, the second solder layer 22 can absorb the heat stress. Accordingly, it is possible to suppress a decrease in reliability of joint.

It is preferable not only to apply the lead solder joint structure to joint of the wire, but also to apply the lead solder joint structure to a waveguide which transmits a RF signal included in a frequency band of the Ka band or a frequency band above the Ka band. That is, in order to minimize a transmission loss, the waveguide is plated with silver. The lead solder joint structure may be used to join such a waveguide and a waveguide flange. In comparison with a dip-brazing method which has been used for joining an aluminum member, it is possible to realize cost reduction and improvement of the reliability by virtue of applying the lead solder joint structure. In general, in the case of production of such waveguides, a base tube and a flange of the waveguide are brazed by the dip-brazing method, and afterward the brazed portion is plated with silver.

Since a dip-brazing furnace is expensive and a joint temperature is high, a professional worker who has a superior art is needed. However, according to the joint method of the present exemplary embodiment, it is possible to carry out joint relatively easily without using the expensive dip-brazing furnace. Accordingly, it is possible to provide the joint structure, which has high reliability, at a low price.

Moreover, in the case of a solar cell panel which is mounted on an artificial satellite, it is preferable to use the joint structure according to the exemplary embodiment for connecting the solar cell panels in series and in parallel. In the case of the solar cell panel, an interconnector, which is made of silver or kovar plated with silver, is joined between cell electrodes by welding. Here, a series of cells which are connected by the interconnectors is called a string. For soldering a wiring member which connects such strings, Sn62 (Sn: 62%, Pb: 36%, Ag: 2%; melting point: 183 degrees centigrade) is usually used. In the case of the above-mentioned connection under the condition that the temperature is about 95 degrees centigrade and the heat cycle is −160 to 95 degrees centigrade, it is possible to acquire good results. However, in the case of the above-mentioned connection under the condition that the temperature is high, that is, about 230 degrees centigrade and the heat cycle is −160 to 230 degrees centigrade, it is quite impossible to secure the reliability of joint. By using the above-mentioned joint structure at such the joint point, it is possible to secure the reliability of joint.

The previous description of embodiments is provided to enable a person skilled in the art to make and use the present invention. Moreover, various modifications to these exemplary embodiments will be readily apparent to those skilled in the art, and the generic principles and specific examples defined herein may be applied to other embodiments without the use of inventive faculty. Therefore, the present invention is not intended to be limited to the exemplary embodiments described herein but is to be accorded the widest scope as defined by the limitations of the claims and equivalents.

Further, it is noted that the inventor's intent is to retain all equivalents of the claimed invention even if the claims are amended during prosecution.

REFERENCE SIGNS LIST 10 wire
11 conductor
12 simple joint layer
20 lead solder joint structure
21 first solder layer
22 second solder layer
23 solder layer
24 third solder layer

The invention claimed is:

1. A method for manufacturing lead soldered joint structure, in which a first member is joined to a second member using lead solder, the method comprising:
   a process for forming a simple joint layer by joining the first member and the second member together using the lead solder; and
   a heat process for heating a joint portion including the joint layer under a predetermined condition and changing the joint layer to a first solder layer, a second solder layer and a third solder layer, the first solder layer including the first member as a core and a main constituent thereof is tin-copper based intermetallic compound, the second solder layer existing between the first solder layer and the second member, joining the first solder layer and the second member together and including lead as a main constituent, and the third solder layer existing between the second member and the second solder layer and a main constituent thereof is tin-silver based intermetallic compound.

2. The method for manufacturing the lead soldered joint structure according to claim 1,
   wherein the heat process condition of the heat process is that, in a case that the lead solder is Sn10, a temperature of the heat process is 200 to 250 degrees centigrade, and a time of the heat process is 1500 to 2000 hours.

3. The method for manufacturing the lead soldered joint structure according to claim 2, wherein the first member is copper wire and a surface of the second member is silver.

4. The method for manufacturing the lead soldered joint structure according to claim 2, wherein the first member is copper wire and a surface of the second member is silver.

* * * * *